INVENTOR
Robert S. Foote

BY
Stevens, Davis, Miller & Mosher
ATTORNEYS

Oct. 12, 1965 R. S. FOOTE 3,211,918

TUNNEL DIODE BINARY CIRCUIT

Filed July 5, 1961 2 Sheets-Sheet 2

INVENTOR

Robert S. Foote

BY

Stevens, Davis, Miller & Mosher

ATTORNEYS

United States Patent Office 3,211,918

Patented Oct. 12, 1965

3,211,918

TUNNEL DIODE BINARY CIRCUIT

Robert S. Foote, Richardson, Tex., assignor to Texas Instruments Incorporated, Dallas, Tex., a corporation of Delaware Filed July 5, 1961, Ser. No. 121,948
9 Claims. (Cl. 307—88.5)

This invention relates to binary circuits and more particularly to a semiconductor-operated bistable circuit utilizing tunnel diodes.

The tunnel diode is a single semiconductor PN junction device that is characterized by a very narrow junction and very highly doped P-type and N-type regions. The familiar current-voltage characteristic curve of a tunnel diode exhibits a region of negative resistance which may be utilized to provide bistable operation by placing the tunnel diode in a series circuit with a resistor and a voltage source. The device can exist in either of two stable conditions, depending upon whether the negative resistance region is reached by increasing or decreasing voltage. This bistable circuit is capable of extremely high switching rates, but this capability has not heretofore been advantageously incorporated in a practical circuit which does not require large switching current inputs. Further, the bistable characteristics of a tunnel diode have not been embodied in a circuit adapted for use in a binary register or scaler.

It is therefore the primary object of this invention to provide a bistable switching circuit utilizing tunnel diodes and capable of employing to greatest advantage the extremely high-speed switching characteristics thereof. Another object is to provide a bistable circuit capable of an extremely rapid switching rate and adapted for use in a binary register or scaler.

In accordance with this invention, the bistable characteristics of the tunnel diode are utilized in a circuit including a pair of semiconductor devices adapted to switch the tunnel diode from one stable state of operation to the other stable state upon the reception of input pulses. For example, the circuit of this invention may utilize a pair of transistors of opposite conductivity types connected in series across a supply source and having their base electrodes driven by the pulses in phase opposition. A tunnel diode is connected between a common point of the transistors and ground while a resistor is connected from the supply source to the tunnel diode to provide bistable operation. A binary-type output is therefore obtained across the tunnel diode.

Additional objects and advantages of this invention will become apparent from the following detailed description of illustrative embodiments, and from the appended claims, when read in conjunction with the accompanying drawing, in which:

Figure 1:
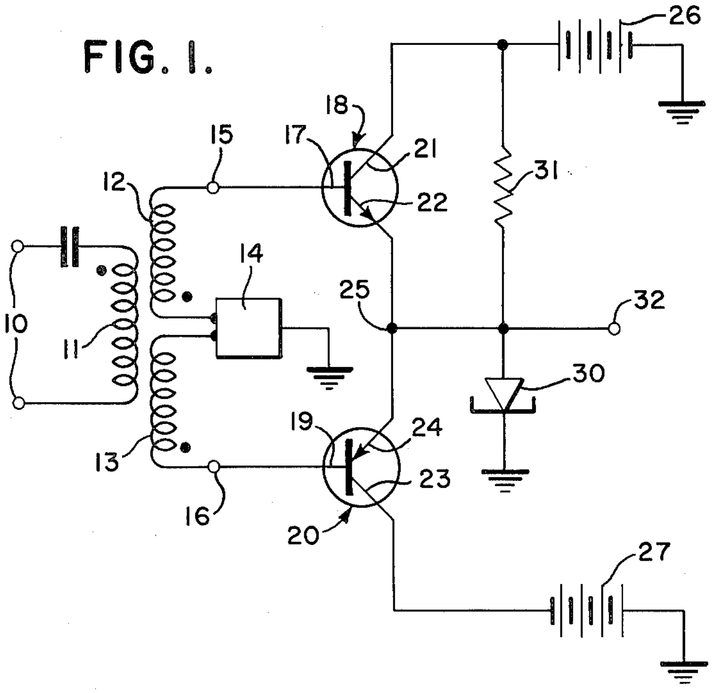
FIGURE 1 is a schematic diagram of a bistable circuit incorporating the principal features of this invention.

With reference to FIGURE 1, there is shown a bistable circuit utilizing a tunnel diode driven by a pair of complementary transistors. A pair of circuit input terminals 10, which may be connected across a source of pulses (not shown), is capacitively coupled to a primary winding 11 of a transformer. The transformer includes a pair of separate secondary windings 12 and 13 which are oriented to produce output voltages according to the dot convention illustrated. The adjacent terminals of the secondary windings 12 and 13 are connected to a suitable biasing means

14 as subsequently described. The biasing device 14 is effective to tend to back-bias the transistors described below. With this arrangement, a negative pulse applied to the input terminals 10 will result in a positive pulse at a terminal 15 on the winding 12 and a negative pulse on a terminal 16 of the winding 13. The terminal 15 is connected to a base electrode 17 of a transistor 18 while the terminal 16 is connected to a base electrode 19 of a transistor 20. The transistor 18 is of the NPN conductivity type and includes a collector 21 and an emitter 22, while the transistor 20 is of the PNP conductivity type including a collector 23 and an emitter 24. The emitters of the two transistors are connected together at a common point 25. The collector 21 of the transistor 18 is connected to the positive terminal of a voltage supply 26 while the collector 23 of the transistor 20 is connected to the negative terminal of a voltage supply 27. Thus it is seen that the two transistors 18 and 20 have their main current-carrying electrodes connected in a series arrangement with the two voltage sources 26 and 27.

To provide the bistable characteristics of the circuit of FIGURE 1, a tunnel diode 30 is connected between the common point 25 and ground. A bleeder resistor 31 is connected from the supply 26 to the tunnel diode 30 to provide a minimum hold-on current. The output of the bistable circuit is taken across the tunnel diode 30 at a terminal 32.

Figure 2:
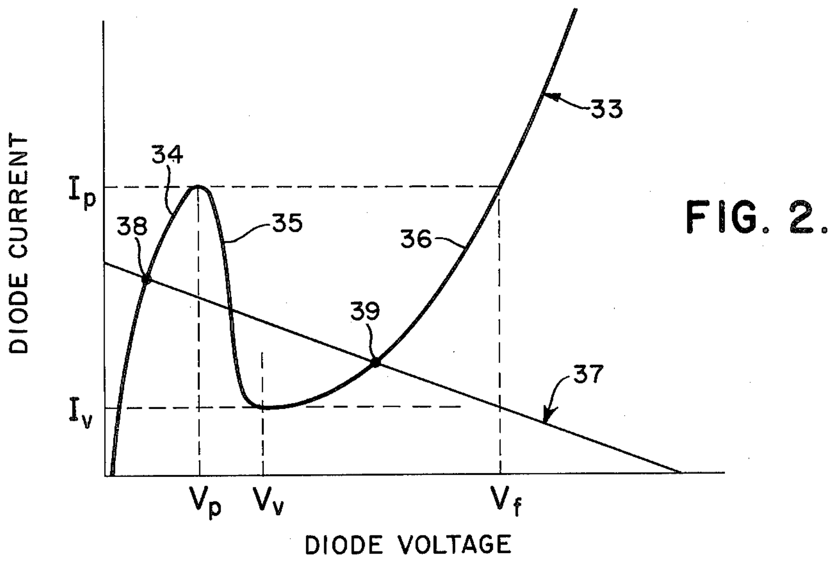
FIGURE 2 is a graphic representation of the current-voltage characteristics of a tunnel diode.

In order to understand the operation of the circuit of FIGURE 1, it is first necessary to examine the characteristics of the tunnel diode 30 which are shown in the graph of FIGURE 2. Generally, tunnel diodes are characterized by a current versus voltage characteristic as illustrated by a line 33 in FIGURE 2. It is seen that three distinct regions are defined by the current-voltage characteristic. Initially, the device exhibits a region of positive resistance, as shown by the portion 34 of the line 33. Then, after a certain voltage $V_p$ or current $I_p$ is reached, a negative resistance region 35 obtains until a voltage $V_v$ or current $I_v$ is reached. Thereafter, the tunnel diode exhibits positive resistance in the region 36 similar to conventional semiconductor diodes. It is seen that for a given current between the values $I_v$ and $I_p$, the voltage across the tunnel diode may exist in one of two stable values; i.e., the diode voltage will either be in the region 34 or in the region 36 depending upon whether the given current was reached by increasing or decreasing current.

In the circuit of FIGURE 1, assuming both transistors to be cut off, it is seen that the tunnel diode 30 is in a series circuit with the resistor 30 and the source 26. This arrangement will provide operation along a load line 37 as seen in FIGURE 2. This line 37 is merely a straight line between the zero current-maximum voltage point determined by the magnitude of the source 26 and the maximum current-zero voltage point determined by the magnitudes of the source 26 and the resistor 31. The tunnel diode circuit can thus exist in a high-current, low-voltage stable state at a point 38 on the load line, or else in a low-current, high-voltage stable state at a point 39. The circuit is unstable in the region 35, obviously, since any slight increase in voltage would decrease the current on the series circuit and decrease the drop across the resistor 31, resulting in a further increase in voltage and decrease in current until the point 39 in the positive resistance region was reached. Likewise, a tendency toward decreasing voltage would result in immediate switching to the point 38.

Assuming that the tunnel diode is initially in the low-voltage, high-current stable state or at the point 38 of FIGURE 2, it is seen that the point 25 and the emitters of the two transistors 18 and 20 are at a very low voltage. Thus, if a negative input pulse is applied to the terminals 10, producing a positive pulse on the base 17 and a negative pulse on the base 19, then conduction through the transistor 18 will increase, virtually shorting the resistor 31 so that current through the tunnel diode will increase above the value $I_p$, driving the tunnel diode 30 into the stable state as defined by the point 39. The negative pulse to base 19 of transistor 20 will not cause conduction of transistor 20 since point 25 and hence emitter 24 of said transistor is at a very low voltage. This low voltage, in conjunction with the positive bias supplied to the base of transistor 20 by the biasing element 14, will back bias the base-emitter junction and prevent conduction of the transistor, diverting the current through the tunnel diode 30. During the time between input pulses, the transistors 18 and 20 remain cut off, but the resistor 31 will conduct a current greater than $I_v$ but less than $I_p$ so that the tunnel diode will remain in the stable state in which it is left. The junction 25 will now be at a relatively high voltage, tending to back-bias the transistor 18 and forward-bias the transistor 20. The next negative pulse applied to the input terminals 10 will be effective to drive the transistor 20 into full conduction, but the resulting positive pulse on the base 17 will be inadequate to overcome the back bias on the transistor 18 due to the drop across the tunnel diode 30. Switching off the transistor 18 and switching on the transistor 20 will reduce the voltage at the point 25, since the current through the resistor 31 will increase and the current through the diode 30 will decrease. This condition is effective to reduce the tunnel diode voltage below the value $V_p$ and tend to reduce the tunnel diode current below the value $I_v$, thus switching the tunnel diode 30 back to its low-voltage stable state. It is thus seen that two stable voltage states will appear at the output terminal 32 and the circuit may be switched between the states by application of negative pulses to the input terminals 10.

Figures 3, 4:
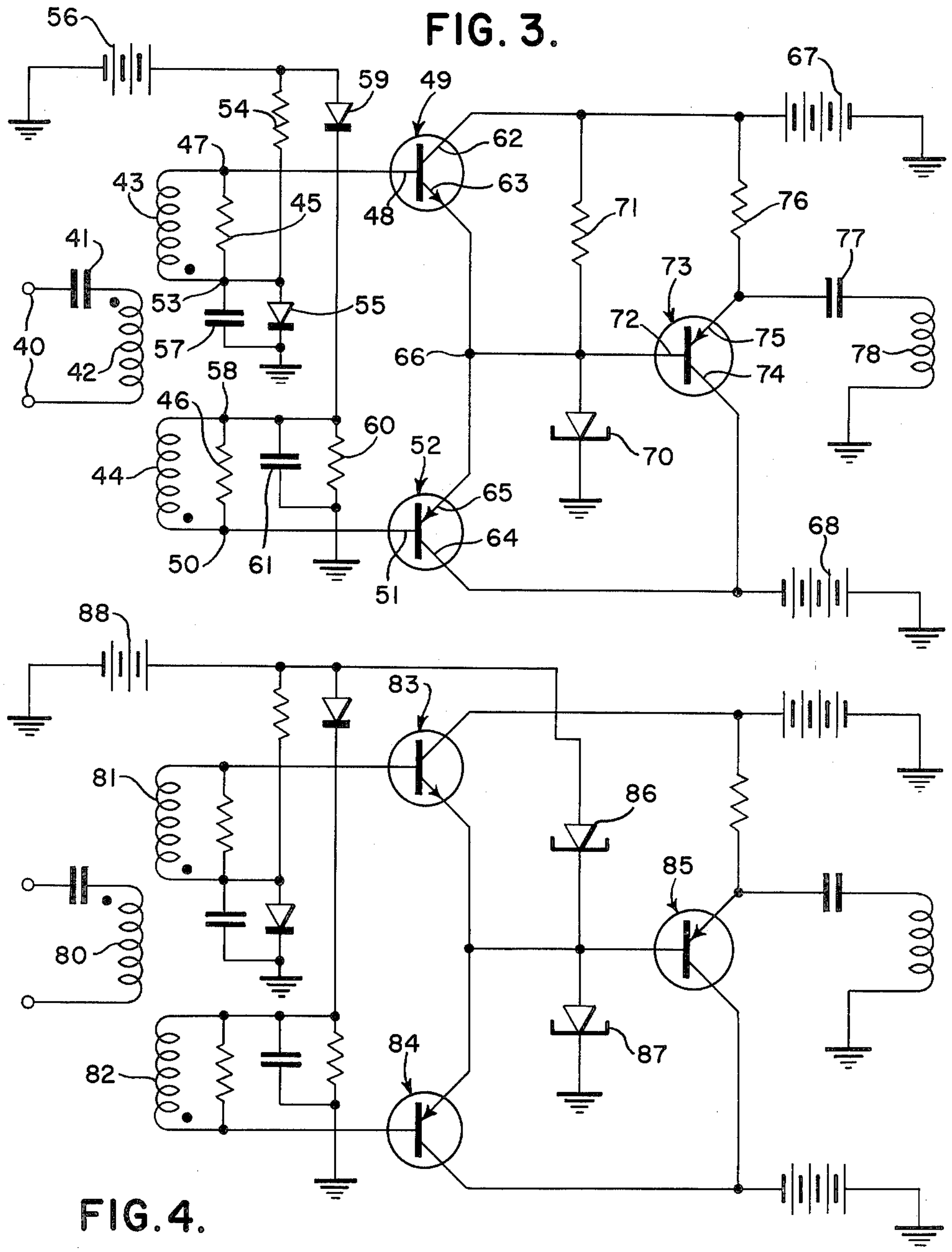
FIGURE 3 is a schematic diagram of a modification of the circuit of FIGURE 1.
FIGURE 4 is a schematic diagram of a modification of the circuit of FIGURE 3.

With reference to FIGURE 3, the invention is shown embodied in a complete bistable circuit arrangement. A pair of input terminals 40 are connected through a capacitor 41 across a primary winding 42 of a transformer. The transformer includes a pair of secondary windings 43 and 44 which are poled according to the dot convention, as shown. The windings 43 and 44 are shunted by a pair of resistors 45 and 46, respectively, to prevent ringing. An outside terminal 47 of the winding 43 is connected to a base 48 of an NPN transistor 49, while an outside terminal 50 of the winding 44 is connected to a base 51 of a PNP transistor 52. An inside terminal 53 of the winding 43 is connected to a biasing arrangement which includes a resistor 54 and a diode 55 connected in series across a positive voltage source 56. The terminal 53 is connected to the junction of the resistor 54 and diode 55 while a capacitor 57 shunts the diode. In a like manner, an inside terminal 58 of the winding 44 is connected to a biasing arrangement including a diode 59 and a resistor 60 connected in series across the voltage source 56, a capacitor 61 being shunted across the resistor 60. These biasing arrangements are effective in tending to back-bias the transistors 49 and 52.

The NPN transistor 49 is seen to include a collector 62 and an emitter 63, while the PNP transistor 52 has a collector 64 and an emitter 65. The emitters 63 and 65 of the two transistors are connected together at a common terminal or junction point 66. In a manner similar to the circuit of FIGURE 1, the collector 62 is directly connected to a positive voltage source 67, while the collector 64 is directly connected to a negative voltage source 68. A tunnel diode 70, having characteristics such as that shown in FIGURE 2, is connected between the junction 66 and ground, and a resistor 71 is connected between the positive source 67 and the diode 70. The anode of the diode 70 is directly connected to a base 72 of a transistor 73. The transistor 73 includes a collector electrode 74, which is directly coupled to the negative source 68, and further includes an emitter electrode 75 which is connected to the positive source 67 through a load resistor 76. The emitter 75 is further connected through a capacitor 77 to an output winding 78 which may comprise the primary winding of a transformer input to a subsequent stage similar to the circuit just described.

It is seen that the circuit of FIGURE 3 is similar to the circuit of FIGURE 1 except that a biasing arrangement is provided for the secondary windings of the input transformer and further that a transistor output stage including the transistor 73 is utilized.

The operation of the circuit of FIGURE 3 is similar to that of the circuit of FIGURE 1 in that a negative pulse applied to the input terminals 40 will be effective to present a positive pulse to the base 48 of the transistor 49 and a negative pulse to the base 51 of the transistor 52. The biasing arrangements connected to the terminals 53 and 58 of the windings 43 and 44, respectively, will determine a quiescent bias condition, however, such that the transistor 49 will tend to have forward bias, and the transistor 52 will tend to maintain negative bias. Further, the addition of the transistor 73 and associated circuitry will provide an impedance match between the tunnel diode 70 and the primary winding 78 of the output transformer.

With reference to FIGURE 4, there is shown a modification of the circuit of FIGURE 3 incorporating the principal features of this invention. Like the circuit of FIGURE 3, an input transformer is utilized having a primary 80 and a pair of secondary windings 81 and 82. One end of each secondary is connected to a biasing arrangement while the other ends are connected to the base electrodes of a pair of transistors 83 and 84 of opposite conductivity types. The common emitters of the transistors are connected to the input of a transistor output stage 85. This common point is likewise connected to the junction of a pair of tunnel diodes 86 and 87. The diode 86, replacing the resistor 71 of FIGURE 3, is connected to a positive voltage supply 88, which may be the same source which supplies the biasing arrangements for the secondary windings 81 and 82. With this circuit configuration, a slightly greater switching speed is obtained, although the circuit is somewhat more critical. The magnitude of the positive voltage supply 88 must be greater than twice the peak voltage $V_p$ and less than twice the voltage $V_f$ of the characteristic so that at no time can both of the tunnel diodes be in the same state at the same time; i.e., one of the tunnel diodes 86 and 87 will always be in its high-voltage state and the other in its low-voltage state. A negative pulse applied to the primary 80 will be effective to switch the tunnel diode combination from one to the other of its stable operating conditions and thus provide an output pulse from the stage 85.

A multi-digit register or scaler may be provided by connecting a plurality of the circuits of FIGURES 3 or 4 in a cascade arrangement; i.e., the output winding 78 of FIGURE 3 may be used as the input or primary winding corresponding to the winding 42 in an input transformer of a subsequent stage. This would provide scaling of a series of pulses at a very rapid rate. This D.-C. readout could be obtained by observing the voltages at the emitter 75 of the output emitter follower of each stage.

Although the invention has been described with respect to specific embodiments, it is not intended that this description be construed in a limiting sense. Various modifications may be made by persons skilled in the art, and it is therefore contemplated that the invention will be limited only by the true scope of the appended claims.

What is claimed is:

1. A bistable circuit comprising a first transistor of the NPN type and a second transistor of the PNP type, the emitters of said transistors being connected together at a junction point, bias means for biasing said transistors to be normally nonconductive, input means adapted to drive the base electrodes of said first and second transistors in opposition, a positive voltage source connected to the collector of said first transistor, a negative voltage source connected to the collector of said second transistor, a tunnel diode connected between said junction point and a reference potential, a resistor connected between said junction point and said positive voltage source to bias said tunnel diode, and output means connected across said tunnel diode.

2. A bistable circuit comprising a first transistor of the NPN type and a second transistor of the PNP type, the emitters of said transistors being connected together at a junction point, means for biasing said transistors to be normally nonconductive, pulse input means adapted to drive the base electrodes of said transistors in opposition, a positive voltage source connected between the collector of said first transistor and a reference potential, a negative voltage source connected between the collector of said second transistor and said reference potential, a tunnel diode connected between said junction point and said reference potential, means connected to said tunnel diode and adapted to maintain said tunnel diode in the region of bistable operation, and output means connected across said tunnel diode.

3. A bistable circuit comprising first and second transistors of opposite conductivity types, each of said transistors having base, emitter and collector electrodes, the emitters of said first and second transistors being connected together at a junction point, an input transformer having a primary winding and first and second secondary windings, a source of signal pulses connected across said primary winding, said first and second secondary windings being coupled to the base electrodes of said first and second transistors whereby said transistors will be driven in opposition upon the occurrence of said signal pulses, bias means to bias each of said transistors to a normally nonconductive state, a first voltage source connected to the collector of said first transistor, a second voltage source connected to the collector of said second transistor, a tunnel diode connected between said junction point and a reference potential, a resistor connected between said first voltage source and said junction point to bias said tunnel diode, and output means connected to said junction point.

4. Apparatus according to claim 3 wherein current source means are connected across said tunnel diode.

5. Apparatus according to claim 4 wherein said current source means includes said first voltage source and said resistor.

6. Apparatus according to claim 4 wherein said current source means includes a voltage source and a second tunnel diode connected in series.

7. Apparatus according to claim 3 wherein said output means comprises a transistor amplifier serially connected between said first voltage source and said second voltage source, said transistor amplifier having a base electrode connected to said junction point.

8. A bistable circuit comprising a first transistor of the NPN type having base, emitter and collector electrodes, a second transistor of the PNP type having base, emitter and collector electrodes, the emitters of said first and second transistors being connected together at a junction point, an input transformer having a primary winding and first and second secondary windings, a source of input pulses connected to said primary winding, said first and second secondary windings being connected to the base electrodes of said first and second transistors respectively, biasing means connected to said first and second secondary windings to bias said first and second transistors toward nonconduction, a positive voltage source connected between the collector of said first transistor and a reference potential, a negative voltage source connected between the collector of said second transistor and said reference potential, a tunnel diode connected between said junction point and said reference potential, resistance means connected between said positive voltage source and said tunnel diode and effective to maintain said tunnel diode in the region of bistable operation, and output means connected across said tunnel diode.

9. A bistable circuit comprising a pair of transistors of opposite conductivity type connected in series, bias means for each of said transistors to bias them in a normally nonconductice state, means for driving the inputs of said transistors in opposition, causing one transistor to conduct at one time and the other transistor to conduct at another time, a tunnel diode connected between a common point of said transistors and a reference potential, and a resistive element connected between a power source and the common point of said transistors and tunnel diode to bias said tunnel diode.

References Cited by the Examiner

UNITED STATES PATENTS

| | | | |
|---|---|---|---|
| 3,015,755 | 1/62 | Wright et al. | 307—88.5 |
| 3,094,631 | 6/63 | Davis | 307—88.5 |
| 3,102,209 | 8/63 | Pressman | 307—88.5 |

OTHER REFERENCES

Tunnel Diode Logic Circuits by W. F. Chow, Electronics, June 24, 1960 (page 104, FIG. 2B relied upon).

JOHN W. HUCKERT, *Primary Examiner.*